US006741147B2

(12) United States Patent
Harris

(10) Patent No.: US 6,741,147 B2
(45) Date of Patent: May 25, 2004

(54) METHOD AND APPARATUS FOR ADJUSTING THE RESONANT FREQUENCY OF A THIN FILM RESONATOR

(75) Inventor: Edward B. Harris, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/261,312

(22) Filed: Sep. 30, 2002

(65) Prior Publication Data

US 2004/0061573 A1 Apr. 1, 2004

(51) Int. Cl.[7] .............................. H03H 9/54; H03H 9/15; H03H 3/04
(52) U.S. Cl. ........................ 333/188; 29/25.35; 310/350
(58) Field of Search ................................ 333/186–192; 310/321, 322, 324, 330, 350; 29/25.35

(56) References Cited

U.S. PATENT DOCUMENTS

| 4,642,508 A | | 2/1987 | Suzuki et al. | 310/321 |
|---|---|---|---|---|
| 5,446,306 A | * | 8/1995 | Stokes et al. | 257/416 |
| 5,587,620 A | * | 12/1996 | Ruby et al. | 310/346 |
| 5,692,279 A | | 12/1997 | Mang et al. | 29/25.35 |
| 5,714,917 A | * | 2/1998 | Ella | 332/144 |
| 6,204,737 B1 | * | 3/2001 | Ella | 333/187 |
| 6,349,454 B1 | | 2/2002 | Manfra et al. | 29/25.35 |
| 6,534,900 B2 | * | 3/2003 | Aigner et al. | 310/326 |
| 6,583,688 B2 | * | 6/2003 | Klee et al. | 333/188 |

FOREIGN PATENT DOCUMENTS

JP  7-226648  * 8/1995

* cited by examiner

Primary Examiner—Barbara Summons
(74) Attorney, Agent, or Firm—John L DeAngelis, Jr.; Beusse Brownlee Wolter Mora & Maire, P.A.

(57) ABSTRACT

A thin film resonator comprising a piezoelectric material and having a controllable or tunable resonant frequency. The resonator is formed on a substrate having a cavity formed therein below the piezoelectric film material. A bending electrode is disposed within the cavity and the application of a voltage between the bending electrode and one of the resonator electrodes, creates an electric field that causes the substrate region to bend. These stresses caused: by the bending are transferred to the thin film resonator, subjecting the piezoelectric film to stresses and thereby changing the resonant properties of the thin film resonator.

20 Claims, 2 Drawing Sheets

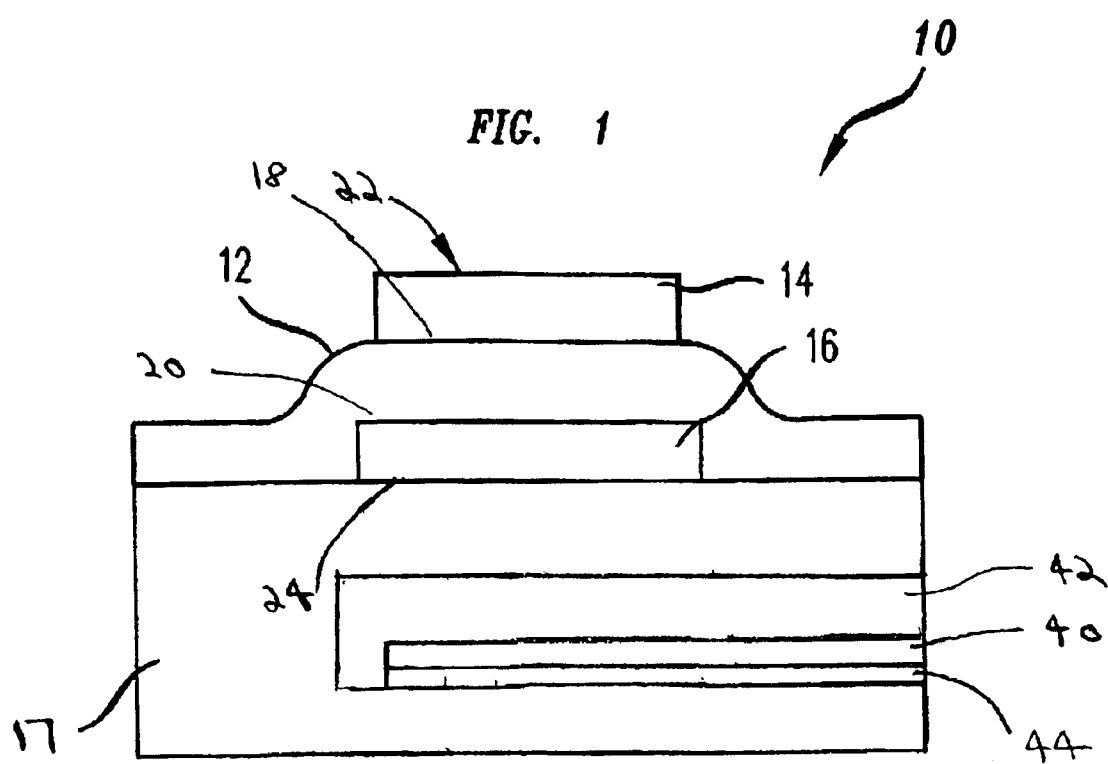

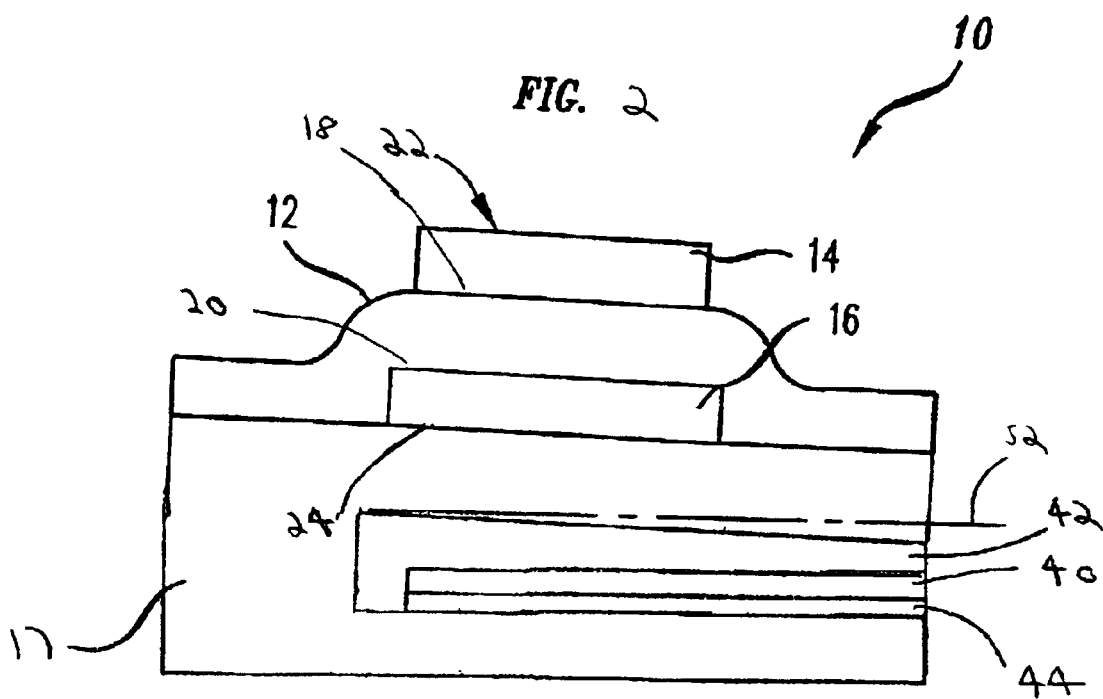

METHOD AND APPARATUS FOR ADJUSTING THE RESONANT FREQUENCY OF A THIN FILM RESONATOR

FIELD OF THE INVENTION

This invention relates generally to thin film resonators and more specifically to a method and apparatus for adjusting the resonant frequency of a thin film resonator.

BACKGROUND OF THE INVENTION

As is known in the art, a quartz crystal exhibits mechanical deformation when a voltage is applied across opposing faces of the crystal. Conversely, if the crystal is mechanically strained, a voltage differential is produced across the crystal faces. This phenonenom is referred to as the piezoelectric effect. Electrically, the quartz crystal operates as a parallel inductor-capacitor tuned circuit. Typically, crystal filters have an extremely high Q (a figure of merit defining the filter bandwidth) and excellent frequency stability.

Piezoelectric crystals formed on a semiconductor substrate are referred to as thin film resonators or thin film acoustic devices. These thin film devices are electromechanical resonators whose resonant frequency is determined by the thickness and acoustic properties of the piezoelectric film. Typically, the devices resonate in the radio frequency to microwave range, for example from about 0.5 gigahertz (GHz) to about 5 GHz in response to an electrical signal applied across, opposing surfaces of the piezoelectric film. The film is conventionally comprised of piezoelectric crystalline material, such as zinc oxide, aluminum nitride, or other crystalline materials that exhibit the piezoelectric effect. The fundamental resonant frequency of the piezoelectric material is determined by dividing the acoustic velocity of the film by twice the film thickness, i.e., $f_r = v/2\,t$. When subjected to an alternating electrical field having a fundamental frequency and harmonics, the piezoelectric film will mechanically vibrate if one of the frequency components is equal to the piezoelectric resonant frequency.

Since the resonant frequency of the piezoelectric material is determined by the thickness and acoustic properties of the piezoelectric film, it is established at the time of fabrication and not tunable thereafter. Since manufacturing process variations can influence the film thickness, considerable effort is expended to rigidly control the manufacturing processes to maintain tight control over the thickness. For example, to achieve the desired resonant frequency requirements, it may be necessary to control the film thickness with a tolerance of less than about 0.1% of the thickness. For example, in one embodiment, deposition of a 1000 nanometer film must be achieved with an accuracy of 0.1%, which is 1 nanometer. Current semiconductor manufacturing processes for thin film deposition are difficult to control beyond about 1% of the film thickness.

BRIEF SUMMARY OF THE INVENTION

The present invention teaches a method for tuning the resonant frequency of a thin film resonator disposed on a semiconductor substrate. Two electrodes are also disposed on the substrate and a voltage applied between them to create a deformation in the substrate. This deformation is also communicated to the thin film resonator, thereby modifying the resonant frequency thereof.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

FIG. 1 is a cross-section illustration of a thin film resonator structure according to the present invention.

FIG. 2 is a cross-section illustration of a stressed thin film resonator.

DETAILED DESCRIPTION OF THE INVENTION

A thin film resonator 10 constructed according to the teachings of the present invention is illustrated in the FIG. 1 cross-section, including a piezoelectric film 12 disposed between electrodes 14 and 16, and mounted on a substrate 17. A voltage applied to the electrodes 14 and 16 creates an electric field perpendicular to opposing surfaces 18 and 20 of the piezoelectric film 12, thus causing the piezoelectric film 12 to expand and contract at its resonant frequency. Conversely, the application of vibratory motion to the piezoelectric film 12 causes the formation of an electrical field and a corresponding voltage at the electrodes 14 and 16. The resonant frequency is determined by the thickness of the piezoelectric film 12, and the acoustic characteristics of the electrodes 14 and 16 and the substrate 17.

The piezoelectric film 12 is formed from a piezoelectric material such as zinc oxide, aluminum nitride or any other crystalline material that exhibits the piezoelectric effect. For example, aluminum nitride is reactively sputtered on to the substrate 17, including the electrode 16, in an atmosphere containing a small amount of nitrogen. The electrodes 14 and 16 are conventionally formed of metal, typically aluminum or gold or another suitable metal, by sputtering or chemical vapor deposition processes. The substrate 17 comprises silicon, doped silicon, polysilicon, gallium arsenide or another material that can serve as the substrate for the formation of semiconductor devices. Thus the thin film resonator 10 can be easily integrated with active semiconductor devices also formed in other regions of the substrate 17. The dimensions of the electrodes 14 and 16 and the piezoelectric film 12 can range from tens to hundreds of microns.

The acoustic impedance mismatch between the surrounding air and a top surface 22 of the electrode 14 creates an acoustic reflecting surface at the top surface 22. The acoustic impedance mismatch between a bottom surface 24 of the electrode 16 and the substrate 17 creates an acoustic reflecting surface at the bottom surface 24. The properties of these reflecting surfaces can be selected to reflect desired operational frequencies of the thin film resonator 10 and to suppress unwanted frequencies, such as harmonic frequencies of the fundamental resonant frequency of the thin film resonator 10, thus creating standing waves in the piezoelectric film 12. Thus the design and formation of the components of the thin film resonator 10 also influence the resonant operational frequency.

According to the teachings of the present invention, the requirement to maintain precise manufacturing tolerances, as taught by the prior art, may be unnecessary. Instead, the resonant frequency of the thin film resonator 10 is adjusted or tuned after the manufacturing process has been completed by the application of mechanical stresses to the substrate 17, which in turn cause the piezoelectric film 12 to bend, thus altering the resonant frequency of the thin film resonator 10. The stresses are induced by the application of a DC (direct current) voltage between a bending electrode 40, located within a cavity 42, and the electrode 16. In another embodiment, an AC (alternating current) voltage can be used to create the stresses. In yet another embodiment the voltage can be applied between the electrode 14 and the bending electrode 40.

For example, to frequency modulate a "carrier signal" (i.e., where the carrier signal is the resonant frequency of the TFR), an audio signal is applied between the bending electrode 40 and the electrode 16, shifting the TFR center frequency in accordance with the audio signal frequency, through the bending stresses created. Thus, according to the teachings of the present invention, the piezoelectric material resonant frequency can be tuned, both as an operational feature and to overcome process induced film thickness variations.

FIG. 2 illustrates the displacement of the thin film resonator 10 due to the voltage application between the bending electrode 40 and either of the electrodes 14 and 16. A dashed line 52 represents the horizontal or non-displacement plane. The displacement from the line 52 in response to the applied voltage can be seen.

Whether AC or DC voltage is applied, the voltage between the bending electrode 40 and one of the electrodes 14 and 16 creates two oppositely charged surfaces on the electrodes, producing an electric field between the electrodes. The force exhibited by the field creates the illustrated displacement.

The choice of material for the substrate 17 affects the bending properties of the applied voltage. Materials such as silicon and silicon dioxide have a relatively large Young's modulus and thus are relatively stiff, requiring a larger voltage for a given displacement than materials with a smaller Young's modulus, such as polysilicon.

The electrode 40 is formed by conventional chemical vapor deposition or sputtering processes, overlying an insulator layer 44 also conventionally formed. In one embodiment the cavity 42 is formed by a wet etch or an isotropic plasma etch after the thin film resonator 10 has been formed, first masking the elements to protect them against etch chemical effects. In another embodiment the cavity 42 is formed before formation of the thin film resonator 10.

The teachings of the present invention are also applicable to thick film devices, that is, the formation of a resonant structure in a thick film structure. In the thin film and the thick film embodiments the bending moment induced by the electrical field can be replaced with a mechanical bending device.

An architecture and process have been described as useful for forming a film resonator having controllable resonant frequency properties on a semiconductor substrate. While specific applications of the invention have been illustrated, the principals disclosed herein provide a basis for practicing the invention in a variety of ways and in a variety of circuit structures. Numerous variations are possible within the scope of the invention. The invention is limited only by the claims that follow.

What is claimed is:

1. A method for tuning the resonant frequency of a film resonator disposed on a semiconductor substrate, the substrate further having at least first and second electrodes disposed thereon, said method comprising applying a voltage between the two electrodes such that the semiconductor substrate deforms and the film resonator oscillates in response to the applied voltage, wherein the resonant frequency of the film resonator is responsive to the deformation.

2. The method of claim 1 wherein the semiconductor substrate includes a cavity therein, and wherein the film resonator is formed on the upper surface of the substrate, and wherein the first electrode is located within the cavity and the second electrode is disposed on the upper surface.

3. The method of claim 1 wherein the film resonator comprises piezoelectric material.

4. The method of claim 1 wherein the film resonator comprises a thin film resonator.

5. A method for forming a thin film resonator, comprising:
providing a semiconductor substrate having an upper surface;
forming a first electrode on the upper surface;
forming a piezoelectric material over the first electrode;
forming a cavity within the semiconductor substrate, wherein the cavity extends at least partially below the piezoelectric material, and wherein the cavity is deformable; and
forming a second electrode in the cavity.

6. The method of claim 5 wherein the piezoelectric material has a resonant frequency, and wherein the application of a voltage between the first and the second electrodes causes deformation of the cavity thereby changing the resonant frequency.

7. The method of claim 5 wherein the piezoelectric material has a resonant frequency, and wherein the application of a voltage between the first and the second electrodes creates stresses within the semiconductor substrate that are mechanically communicated to the piezoelectric material, changing the resonant frequency thereof.

8. The method of claim 5 wherein the piezoelectric material is selected from among zinc oxide and aluminum nitride.

9. The method of claim 5 further comprising forming an insulator layer on the floor surface of the cavity prior to forming the second electrode thereover.

10. The method of claim 5 further comprising forming a third electrode overlying the piezoelectric material, and wherein the application of a voltage between the first and the third electrodes causes the piezoelectric material to vibrate.

11. A tunable film resonator comprising:
a semiconductor substrate;
first and second electrodes disposed on said substrate; and
a piezoelectric material disposed on said substrate, characterized in that when
a voltage is applied between said first and said second electrodes said semiconductor substrate deforms, and a resonant frequency characteristic of said piezoelectric material is changed.

12. The tunable film resonator of claim 11 wherein the film resonator comprises a thin film resonator.

13. A tunable film resonator, comprising:
a semiconductor substrate having an upper surface;
a first electrode on the upper surface;
a piezoelectric material overlying said first electrode;
a second electrode overlying the piezoelectric material:
a cavity within said substrate extending at least partially below said piezoelectric material, wherein the cavity is defined by an upper and a lower surface and a connecting sidewall therebetween; and
a third electrode in the cavity, wherein the application of a voltage between either the first and the third electrodes or the second and the third electrodes causes deformation of the upper surface of the cavity relative to the sidewall of the cavity.

14. The tunable film resonator of claim 13 wherein the piezoelectric material has a resonant frequency, and wherein deformation of the upper surface of the cavity relative to the sidewall of the cavity thereby deforms the piezoelectric material, changing the resonant frequency thereof.

15. The tunable film resonator of claim 13 wherein the resonant frequency is affected by the acoustic properties of the semiconductor substrate.

16. The tunable film resonator of claim 13 further comprising an insulator layer on the floor surface of the cavity, and wherein the third electrode overlies said insulator layer.

17. The tunable film resonator of claim 13 wherein the piezoelectric material is selected from among zinc oxide and aluminum nitride.

18. The tunable film resonator of claim 13 wherein the application of a voltage between the first and the second electrodes causes the piezoelectric material to vibrate.

19. The tunable film resonator of claim 13 wherein a first voltage is applied between the first and the second electrodes causing the piezoelectric material to vibrate at a resonant frequency, and wherein the resonant frequency is modified by deformations caused by the application of a third voltage between the first and the second electrodes.

20. The tunable film resonator of claim 13 comprising a tunable thin film resonator.

* * * * *